United States Patent [19]

Okada

[11] Patent Number: 4,702,995

[45] Date of Patent: Oct. 27, 1987

[54] METHOD OF X-RAY LITHOGRAPHY

[75] Inventor: Koichi Okada, Tokyo, Japan

[73] Assignee: NEC Corporation, Tokyo, Japan

[21] Appl. No.: 769,054

[22] Filed: Aug. 26, 1985

[30] Foreign Application Priority Data

| Aug. 24, 1984 | [JP] | Japan | 59-176221 |
| Aug. 24, 1984 | [JP] | Japan | 59-176222 |
| Aug. 24, 1984 | [JP] | Japan | 59-176223 |
| Sep. 6, 1984 | [JP] | Japan | 59-186832 |

[51] Int. Cl.$^4$ .......................... G03C 5/00; G03C 5/04
[52] U.S. Cl. .................................... 430/311; 430/325;
430/326; 430/327; 430/328; 430/394; 430/494;
430/966; 430/967
[58] Field of Search ............... 430/311, 325, 326, 327,
430/328, 394, 494, 966, 967

[56] References Cited

U.S. PATENT DOCUMENTS

| 4,018,938 | 4/1977 | Feder et al. ............................ 427/43 |
| 4,104,070 | 8/1978 | Moritz et al. ............................ 96/36 |
| 4,125,418 | 11/1978 | Vinton ................................. 148/175 |
| 4,263,385 | 4/1981 | Pampalone ............................ 430/25 |
| 4,263,386 | 4/1981 | Datta et al. ............................ 430/25 |
| 4,301,237 | 11/1981 | Burns ................................... 430/394 |
| 4,308,337 | 12/1981 | Roach et al. ......................... 430/296 |
| 4,324,850 | 4/1982 | Tomita et al. ......................... 430/24 |
| 4,373,018 | 2/1983 | Reichmanis et al. ................ 430/312 |
| 4,394,437 | 7/1983 | Bergadahl et al. ................... 430/312 |
| 4,403,151 | 9/1983 | Mochiji et al. ..................... 250/492.2 |
| 4,440,851 | 4/1984 | Tosaka et al. ....................... 430/378 |
| 4,456,679 | 6/1984 | Leyrer et al. ....................... 430/326 |
| 4,465,934 | 8/1984 | Wosterberg et al. ............... 250/398 |
| 4,506,004 | 3/1985 | Sullivan .............................. 430/312 |
| 4,508,813 | 4/1985 | Nakagawa .......................... 430/296 |
| 4,528,261 | 7/1985 | Hauser ............................... 430/322 |
| 4,544,627 | 10/1985 | Takahashi et al. ................. 430/325 |
| 4,595,651 | 6/1986 | Grossa ................................ 430/394 |
| 4,600,667 | 7/1986 | Uchida ................................. 430/22 |
| 4,600,684 | 7/1986 | Yamashita et al. ................ 430/296 |

Primary Examiner—John E. Kittle
Assistant Examiner—Patrick J. Ryan
Attorney, Agent, or Firm—Sughrue, Mion, Zinn, Macpeak & Seas

[57] ABSTRACT

A method of lithography employing an electromagnetic wave having a very short wave length such as X-ray and a resist layer sensitive to that electromagnetic wave is disclosed. The irradiation process is divided into two steps. One step is selectively irradiating the electromagnetic wave, as in the prior art, to the resist layer in a desired pattern. The other steps is non-selective irradiation over the entire area of the resist layer. The latter step may be conducted with a plurality of workpieces such as semiconductor wafers simultaneously.

17 Claims, 15 Drawing Figures

METHOD OF X-RAY LITHOGRAPHY

BACKGROUND OF THE INVENTION

The present invention relates to a method of lithography using electromagnetic wave and resist sensitive to that wave for micro-fine pattern of 1 μm or less on a semiconductor substrate, and more particularly to X-ray lithography.

The exposure technique by electromagnetic wave having shorter wave length than visible light or ultraviolet light, such as X-ray or electron beam, is expected as a reprint technique that has great potential in the future because of reliable high resolution for a submicron width pattern and, at present, vigorous research and development are being carried out at various places. The technique is explained, for example, in a publication issued in 1972, "Electronics Letters" Vol. 8, No. 4, p.p. 102~104. The X-ray or electron beam exposure technique in the prior art, however, requires a long time to reprint a pattern in an X-ray or electron beam resist layer provided on a substrate such as a semiconductor wafer and, therefore, the throughput in the technique is low. Factors determining the throughput in the X-ray or electron beam exposure are the intensity of an X-ray or electron beam source and the sensitivity of the resist. In the case of an X-ray source, the most popularly used source is of a type which can emit X-rays from a target by impacting an electron beam on to the target. However, the conversion efficiency of the electron beam output to X-rays is as extremely low (i.e. $\sim 10^{-4}$) and it is a diverging radiation source.

Therefore, X-rays obtained by the source are weak. On the other hand, a plasma X-ray source which is expected as a high-luminescence X-ray source is a pulsed X-ray source, and a conversion efficiency for one pulse is $\geq 10^{-2}$, but in a practical use, many problems must be resolved such as various damage that results from generation of pulses. In addition, with regard to a synchrotron orbital radiation source for which a trend of research and development has developed recently, it is too early to determined its practicality. Accordingly, so long as an X-ray source concerns, at present, it can be said that the source excited by the electron beam is most suitable for commercial X-ray exposure apparatus. In this respect, that is, in the case of employing the source excited by the electron beam, particularly a high sensitivity of X-ray resist is necessary. In order to obtain a sufficient throughput, development of X-ray resist having a high sensitivity of 10 mJ/cm$^2$ or less is necessary. However, X-ray resist having such a high sensitivity and utility is readily not available at present. It is believed that a considerable period of development in the future will be necessary until X-ray resist having a sensitivity of 10 mJ/cm$^2$ or less, which is applicable to fabrication of practical devices, is available. In commercial exposure apparatuses, one of the most important factors is the throughput and, as described above, in the X-ray exposure technique also, enhancement of the throughput is an important problem. The situation is similar for the case where electron beam exposure techniques are used.

SUMMARY OF THE INVENTION

One object of the present invention is to provide a novel method of lithography in which high-throughput in the exposure process is made possible.

According to the present invention, there is provided a method of lithography comprising the steps of preparing a workpiece having a substrate such as a semiconductor wafer with a metallic film formed on the major surface of the wafer via an insulating layer, coating the surface of the substrate with a layer of a resist material sensitive to a short-wavelength electromagnetic wave, selectively irradiating the mentioned electromagnetic wave to the layer of the resist material to form a selectively irradiated pattern, and non-selectively irradiating the mentioned electromagnetic wave to the layer of the resist material such that the substantial area of the surface of the layer of the resist material is entirely and uniformly irradiated.

According to a preferred embodiment of the present invention, there is provided a method of an X-ray lithography comprising steps of preparing a workpiece having a substrate such as a semiconductor wafer with a metallic film formed on the major surface of the wafer via an insulating layer and an X-ray resist layer formed on the substrate, that is, on the metallic film of the semiconductor wafer, performing a first steps of irradiating X-rays on the X-ray resist layer without interposing any X-ray mask between an X-ray source and the X-ray resist layer so that X-rays in the first step are uniformly irradiated over the whole parts of the surface of said X-ray resist layer, setting an X-ray mask above the X-ray resist layer, the X-ray mask having a support member made of, for example, silicon, a membrane transmitting X-rays, made of, for example, a thin silicon film, a thin silicon oxide film, a thin silicon nitride film or a composite film of these thin films and supported by the support member and an X-ray absorber pattern selectively provided on the membrane to form an X-ray absorber section where the X-ray absorber pattern is present and to form an X-ray transmitting section where the X-ray absorber pattern is not present, and performing a second step of irradiating X-rays on the X-ray resist layer through the X-ray mask.

The X-ray absorber pattern may be made of gold, platinum, copper, etc. The X-ray apparatus in both X-ray irradiating steps are different each other.

In the selectively irradiating step, a conventional apparatus of the X-ray or electron beam lithography is used. In the non-selectively irradiating step, neither mask nor pattern-forming means is necessary, and it is preferred that a plurality of workpieces, that is, semiconductor wafers are simultaneously irradiated to increase the throughput. As a result, a special and simple apparatus may be provided.

In case of X-ray irradiation, an X-ray source has a target, and the soft X-rays are emitted by exciting the target with an electron beam. For example, if an electron beam of 10 KW collides against the target, AlKα (8.34 Å), SiKα (7.13 Å), MoLα (5.41 Å) or PdLα (4.37 Å) is emitted from the target when the target is made of aluminum, silicon, molybdenum or palladium, respectively. In any case, the strength of the soft X-ray by respective targets is weak because the conversion efficiency of the electron beam to X-rays is extremely low as mentioned above. Further, the X-ray resist may be a negative resist such as JSR MES-X, PGMA, JSR MES-E, CMS-EX or αM-CMS(S) each having a sensitivity value of 60 mJ/cm$^2$ or more. Also, the X-ray resist may be a positive resist such as FBM-120, RE-5000P, RE-5000P, FPM-210 or AX-2400 each having a sensitivity value of 45 mJ/cm$^2$ or more. When the negative resist is used, portions of the negative resist layer under the transmitting section of the mask must be sufficiently irradiated by X-rays above the sensitivity value so that after a development process and a rinsing process, the portions of the negative resist layer would remain. Also, when the positive resist is used, portions of the positive resist layer under the transmitting section of the mask must be sufficiently irradiated by X-rays above the sensitivity value so that after a development process and a rinsing process, the portions of the positive resist layer would disappear.

In the case of manufacturing a semiconductor device, when a negative X-ray resist having 200 mJ(milli joule)/cm$^2$ sensitivity value is coated on a semiconductor wafer of 4 inch diameter, because of a restriction of an effective area of an X-ray mask the exposure must be conducted nine times by dividing the surface the semiconductor wafer. Namely, after exposure of one area of the wafer is completed, the wafer is horizontally moved in X and/or Y directions about 3 cm. Then, the exposure of X-rays in the next area of the wafer is conducted, and repeated sequentially. The portions of the resist layer under the transmitting section of the mask must be irradiated about 240 mJ/cm$^2$ or more, and the portions of the resist layer under the X-ray absorber section of the mask must be restricted to irradiation of 180 mJ/cm$^2$ or less. In this case, about 7 minutes irradiation of X-rays is necessary for one area of the wafer. Therefore, the whole exposure time to conduct the X-ray lithography on one semiconductor wafer in one process step becomes about 63 (7×9) minutes. It is a very long time and canses the low throughput in the X-ray lithography.

According to the method of the present invention, the non-selective irradiation may be performed either after or before the selective irradiation. Therefore, the whole exposure time to conduct the lighography on one semiconductor wafer in one process step becomes short and the high throughput can be expected. More particularly, in the above mentioned case, without any mask, the semiconductor wafer is wholly irradiated for about 5 minutes, whereby the resist on the semiconductor wafer uniformly receives an energy of about 170 mJ/cm$^2$. Before or after the non-selective irradiation, the above mentioned conventional selective exposure is conducted. However, according to the present invention, the selected portions of the resist subjected to irradiation necessitate an energy of only 70 mJ/cm$^2$. Therefore, the exposure time on one area of the wafer to conduct patterning is only 2 minutes. Therefore, the total exposure time to conduct the lithography on the semiconductor wafer in one process step becomes only 23 (2×9+5) minutes. Of course, the total amount of energy in portions other than the pattern during the two irradiation steps can be maintained 180 mJ/cm$^2$ or less. The uniform irradiation without mask of the present invention can be simultaneously conducted with a plurality of workpieces, that is, a plurality of semiconductor wafers. In this case, the time of the uniform irradiation, 5 minutes for the above mentioned example, results in greater throughput.

In case of X-ray exposure, the time of the uniform irradiation is favorably determined such that an amount of X-ray irradiated onto the whole surface of the negative or positive resist layer during the uniform irradiation of X-rays without mask is 10 to 35 mJ(milli joule)/cm$^2$ below the sensitivity value of the resist layer.

DETAILED DESCRIPTION OF THE PREFERRED EMBODIMENTS

Figure 1:
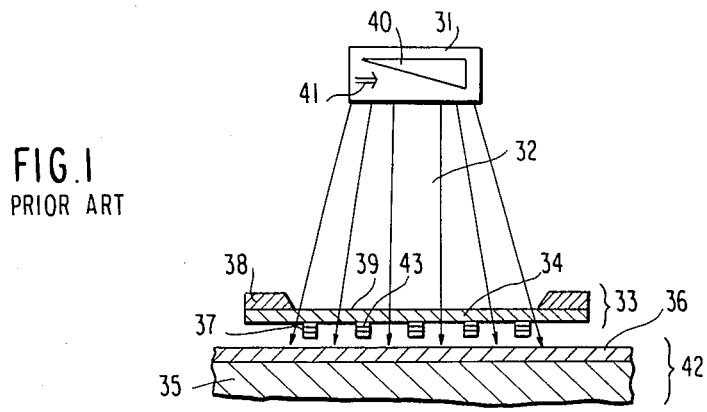
FIG. 1 is a conceptional view of the X-ray lithography in the prior art.

Referring to FIG. 1, an X-ray mask 33 is positioned above a workpiece 42, and an X-ray source 31 is installed on the X-ray mask. The workpiece 42 comprises a semiconductor body 35 and an X-ray resist layer 36 formed on a metallic film (not shown) provided on the major surface of the semiconductor body via an insulating layer (not shown). An X-ray mask 33 comprises a support member 38, a membrane 39 and an X-ray absorbing pattern 43, and forms an X-ray transmitting section 34 and a X-ray absorber section 37. Soft X-rays 32 radiated from a target 40 of the X-ray source 31 by impacting an electron beam 41 to the target pass through the X-ray transmitting section 34 of an X-ray mask 33, and irradiate the X-ray resist 36. At this moment, the X-rays do not pass through the X-ray absorber pattern section 37 formed on the membrane 39 and, thus, section 37 acts as a mask pattern. In the X-ray lithography of the prior art, the mask 33 is always provided between the X-ray source 31 and the workpiece 42 and, therefore, the throughput thereof is decreased.

Figure 2A:
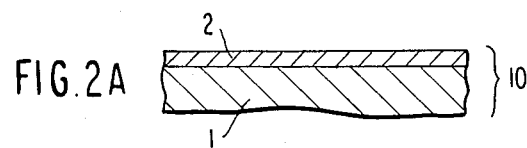
FIGS. 2A to 2C are conceptional views showing a first embodiment of the present invention.
Figure 3A:
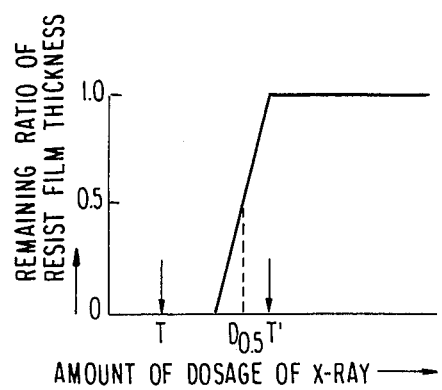
FIGS. 3A and 3B are diagrams for explaining the principle of the X-ray exposure method according to the first embodiment of the present invention, FIG. 3A being a diagram showing a characteristic of X-ray resist under an X-ray transmitting section of an X-ray mask, FIG. 3B being a diagram showing the same characteristic under an X-ray absorber section of the mask.
Figure 3B:
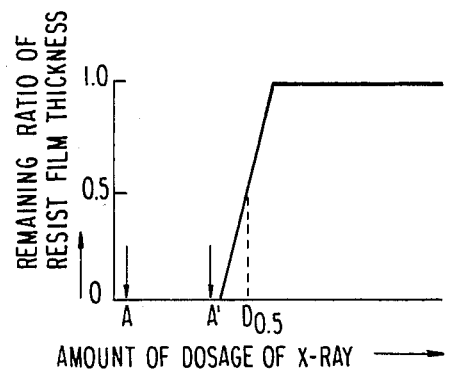

First embodiment:

Referring to FIG. 2A, a workpiece 10 is prepared. The workpiece 10 comprises a semiconductor wafer 1 with a metallic film (not shown) on a major surface of the semiconductor substrate via an insulating layer (not shown), and a negative type X-ray resist layer 2 of 1 μm thickness formed on the semiconductor wafer, that is, the resist layer is attached to the metallic film. The negative type X-ray sensitivity value is 200 mJ/cm$^2$, that is, D in FIGS. 3A and 3B is 200 mJ/cm$^2$. In the preferred embodiment, the sensitivity value of a negative resist layer is characterized in that after the development and the rinsing of the negative resist layer which has been irradiated by X-rays in an amount equal to the sensitivity value, the thickness of the resist layer becomes one half of the initial thickness. In this embodiment, the initial thickness of the resist layer is 1 μm, and therefore, if X-rays irradiate the surface of the resist layer at the dosage of 200 mJ/cm$^2$, after the development and rinsings, the thickness of the resist layer becomes 0.5 μm.

Figure 2B:
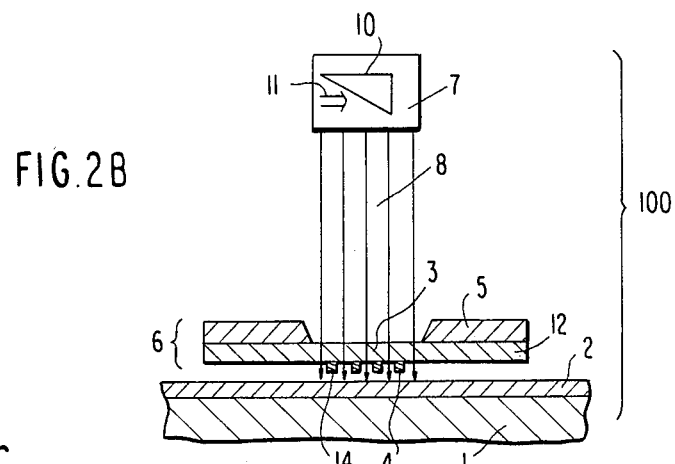

Subsequently, as shown in FIG. 2B, the workpiece 10 is installed in one X-ray lithography apparatus 100. An X-ray mask 6 is positioned on the negative resist layer 2, and an X-ray source 7 is positioned above the mask 6. The X-ray mask 6 comprises a ring shape, in the plan view, support member 5, a membrane 12 supported by the support member, and an X-ray absorbing pattern 4 so as to form an X-ray transmitting section 3 of the mask where the X-ray absorbing pattern is not provided and to form an X-ray absorber section 14 where the X-ray absorbing pattern is provided. Soft X-rays 8 is emitted from a target 10 of the X-ray source 7 by impacting an electron beam 11 to the target 10 and irradiated through the mask to the surface of the resist layer 2, selectively, about 2 minutes. Then, portions of the resist layer 2 under the X-ray transmitting section 3 of the mask 6 is irradiated X-rays of 70 mJ/cm$^2$. That is represented as T in FIG. 3A. Portions of the resist layer 2 under the X-ray absorber section 14 of the mask 6 is irradiated X-rays of not more than 10 mJ/cm$^2$. That is represented as A in FIG. 3B. If the semiconductor wafer has the large size with respect to an effective area of the mask, the semiconductor wafer is moved X and/or Y direction for example, 3 cm intervals as mentioned above.

Figure 2C:
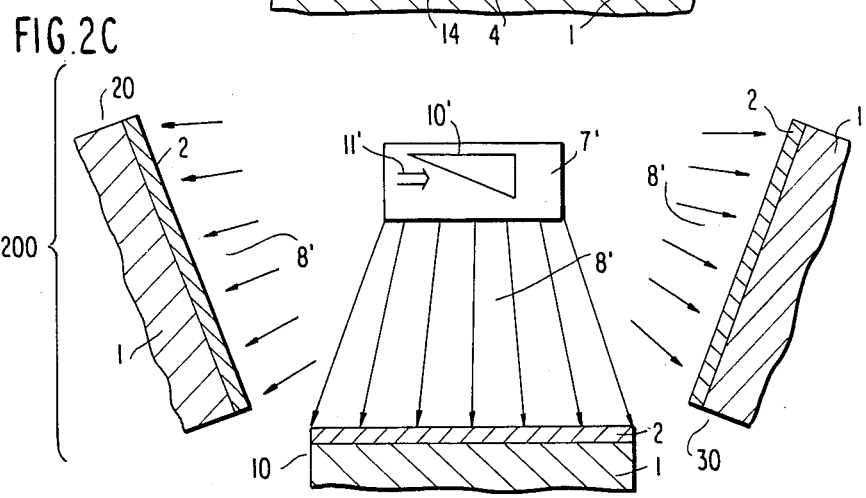

Then, as shown in FIG. 2C the workpiece 10 is installed in another apparatus 200 with other workpieces 20, 30 which has been completed the process step shown in FIG. 2 as the workpiece 10. In the apparatus 200, any X-ray mask is not provided between an X-ray source 7' and respective workpieces 10, 20, 30. Soft X-rays 8' are emitted from a target 10' by impacting an electron beam 11' to the target and irradiated directly and uniformly the whole surface of the respective negative resist layers 2 of the workpices 10, 20, 30 during 5 minutes. Then, X-rays of 170 mJ/cm$^2$ are irradiated in the respective negative resist layers 2 uniformly in their entire portions. Consequently, portions of the resist under the transmitting section 3 of the mask 6 in the first irradiating step in FIG. 2B are irradiated the total X-rays of 240 mJ/cm$^2$ that is indicated as T' in FIG. 3A and is above the sensitivity value $D_{0.5}$. On the other hand, portions of the resist under the absorber section 14 of the mask 6 in the first irradiating step in FIG. 2B are irradiated the total X-rays of 180 mJ/cm$^2$ or less that is indicated as A' in FIG. 3B and is below the sensitivity value $D_{0.5}$. Namely, in the second irradiating step in FIG. 2C, uniform X-rays of 170 mJ/cm$^2$ indicated as (T'—T) in FIG. 3A and (A'—A) in FIG. 3B are irradiated in the resist layer. FIGS. 3A and 3B show a sensitivity characteristic of negative type X-ray resist as a relation of a film remaining rate versus an X-ray dose. FIG. 3A indicates a sensitivity characteristic of X-ray resist under the X-ray transmitting section of the X-ray mask, while FIG. 3B indicates the same characteristic of X-ray resist under the X-ray absorber pattern section. It is assumed that in the case shown in FIG. 3A (under the X-ray transmitting section) a dose of T was given to the negative type X-ray resist by the X-ray exposure making use of an X-ray mask shown in FIG. 2B. This T is set at a smaller value than a sensitivity $D_{0.5}$ (a dose for which a film thickness remaining rate after development becomes 0.5) of the negative type X-ray resist. At this moment, in the case shown in FIG. 3B (under the X-ray absorber pattern section), a considerably smaller dose A than T is given to the negative type X-ray resist layer. Subsequently, X-ray overall irradiation without the X-ray mask, as shown in FIG. 2C, is carried out in another apparatus. It is possible to make setting such that at this time, in the case of FIG. 3A, a total X-ray dose T' exceeding the sensitivity $D_{0.5}$ is given to the negative type X-ray resist, while in the case of FIG. 3B a total X-ray dose A' which is smaller than the sensitivity $D_{0.5}$ but larger than A (a film remaining rate equals zero) is given to the same. In other words, in the case of FIG. 3A, an X-ray dose of T is given to the negative type X-ray resist by the first exposure and an X-ray dose of (T'—T) is given to the resist by the second exposure, while in the case of FIG. 3B, an X-ray dose of A is given to the negative type X-ray resist by the first exposure and an X-ray dose of (A'—A) is given to the same by the second exposure. In this way, it is possible to make exposure settings such that a difference between an X-ray dose in the X-ray transmitting section and an X-ray dose in the X-ray absorber pattern section, applied to the negative type X-ray resist by X-ray exposure that uses the X-ray mask shown in FIG. 2B, may provide a negative type reprint pattern in which remaining film rates are, for instance, unity and zero, as a result of the subsequent X-ray overall irradiation without the X-ray mask (FIG. 2C). As described above, it is an essentially necessary condition of the present invention to perform X-ray exposure twice, that is, to perform X-ray exposure making use of an X-ray mask and subsequent X-ray overall irradiation without an X-ray mask. Where X-ray exposure is performed twice, and, a plurality of apparatuses are used, parallel processing is possible. Especially, with regard to the step of X-ray overall irradiation, since it is believed that the exposure time for each one of the workpieces painted with the negative type X-ray resist may be long, a system in which a large number of workpieces are exposed jointly, is possible. If such parallel processing is carried out, after all it becomes possible to greatly shorten the exposure time for each one of the workpieces, and thereby a high throughput can be realized. Eventually, the exposure time is almost restricted by the first X-ray exposure making use of the X-ray mask, the throughput would be determined thereby.

Figure 4A:
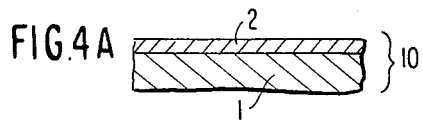
FIGS. 4A to 4C are conceptional views showing a second embodiment of the present invention.
Figure 4B:
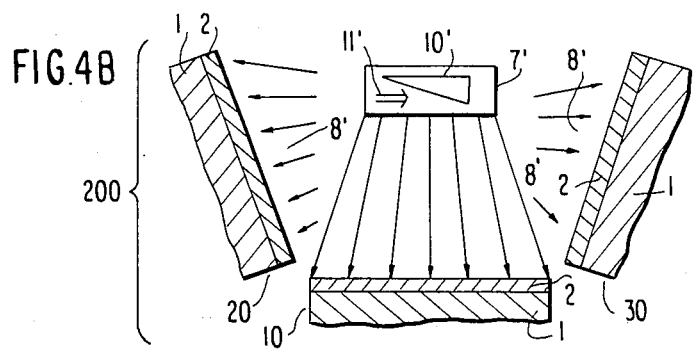
Figure 4C:
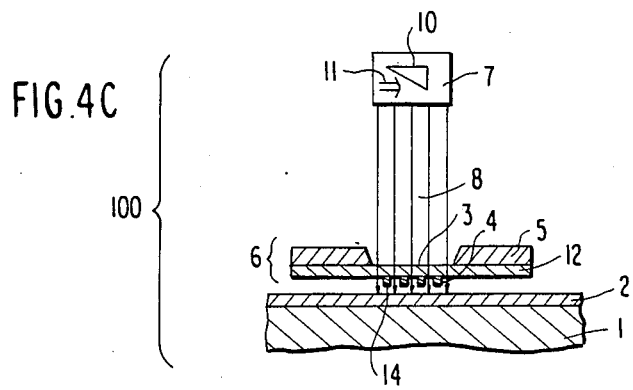
Figure 5A:
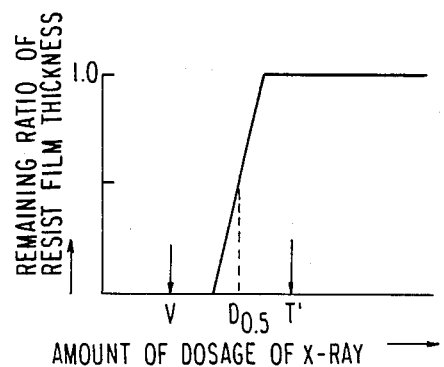
FIGS. 5A and 5B are diagrams for explaining the principle of the X-ray exposure method according to the second embodiment of the present invention, FIG. 5A being a diagram showing a characteristic of X-ray resist under an X-ray transmitting section of an X-ray mask, FIG. 5B being a diagram showing the same characteristic under an X-ray absorber section of the mask.
Figure 5B:
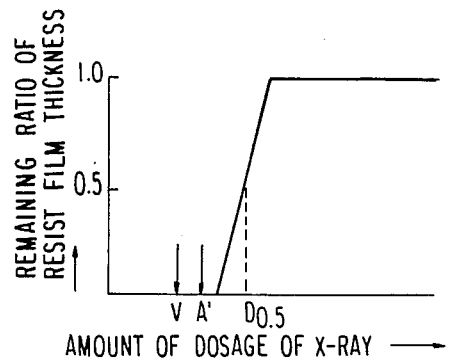

Second embodiment:

In FIGS. 4A to 4C of the second embodiment, the same functions as those in FIGS. 2A to 2C are indicated as the same numerals. In the second embodiment, a plurality of workpieces 10, 20, 30 are uniformly irradiated by X-rays 8' in the apparatus 200 in the first irradiating step during 5 minutes without interposing any X-ray mask between each workpiece and the X-ray source 7'. Thereafter, each workpiece is installed in a conventional X-ray lithography apparatus 100, and performed the second irradiating step to irradiate X-rays 8 during 2 minutes from the X-ray source 7 through the X-ray lithography mask 6. Portions of the negative X-ray resist layer 2 under the transmitting section 3 of the mask 6 are irradiated by X-rays of, for example, 70 mJ/cm$^2$ in the second irradiated step in FIG. 4C. Whereas, the portions have been already irradiated X-rays of, for example, 170 mJ/cm² in the first uniform irradiating step. Therefore, the total amount of dosages of X-rays becomes 240 mJ/cm². As seen in FIG. 5A, the portions are irradiated by X-rays of V (170 mJ/cm²) in the first step, and of (T'-V) (70 mJ/cm²) in the second step. The total irradiating X-rays T' becomes 240 mJ/cm² which is beyond the sensitivity value $D_{0.5}$ of 200 mJ/cm². On the other hand, portions of negative X-ray resist layer 2 under the absorbor section 41 of the mask 6 are irradiated by X-rays of, for example, 7 mJ/cm². Whereas, the portions have been already irradiated X-rays of, for example, 170 mJ/cm² in the first uniform irradiating step. Therefore, the total amount of dosage of X-rays becomes 178 mJ/cm². As seen in FIG. 5B, the portions are irradiated by X-rays of V (170 mJ/cm²) in the first step, and of (A'-V) (7 mJ/cm²) in the second step. The total irradiating X-rays A' becomes 178 mJ/cm² which is below the sensitivity value $D_{0.5}$ of 200 mJ/cm².

Figure 6A:
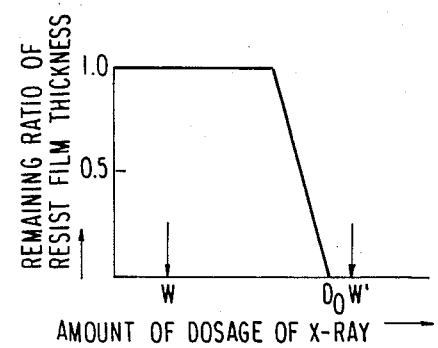
FIGS. 6A and 6B are diagrams for explaining the principle of the X-ray exposure method according to a third embodiment of the present invention, FIG. 6A being a diagram showing a characteristic of X-ray resist under an X-ray transmitting section of an X-ray mask, FIG. 6B being a diagram showing the same characteristic under an X-ray absorber section of the mask.
Figure 6B:
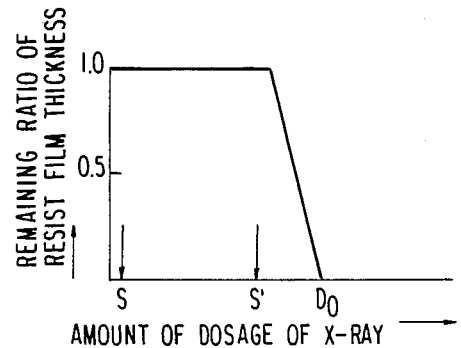

Third embodiment:

The process is the same as the first embodiment shown in FIGS. 2A to 2C. However, a positive X-ray resist layer, for example, FBM-120 is used in the third embodiment. Therefore, the negative X-ray resist layer 2 in FIGS. 2A to 2C is replaced with the positive X-ray resist layer. Referring to FIGS. 6A and 6B, the sensitivity value $D_0$ of a positive resist layer is characterized in that after the development and the rinsings of the positive resist layer which has been irradiated by X-rays at an amount equal to the sensitivity value, the thickness of the resist layer becomes just zero. In the first irradiating step through the mask 6, portions of the positive resist layer under the transmitting section 3 of the mask are irradiated by X-rays 8 of 30 mJ/cm², which is represented as W in FIG. 6A. On the other hand, portions of the positive resist layer under the absorber section 14 of the mask 6 are irradiated by X-rays 8 of 5 mJ/cm² which is represented as S in FIG. 6B. Next, the second irradiating step is conducted, to irradiate X-rays 8' of 30 mJ/cm² uniformly over the entire surface of the positive resist layer in the apparatus 200. Therefore, the total amount of X-rays (W' in FIG. 6A) in the portions of the positive resist layer under the transmitting section becomes 60 mJ/cm² (30 mJ/cm² + 30 mJ/cm²) which is above the sensitivity value $D_0$ (45 mJ/cm²). On the other hand, the total amount of X-rays (S' in FIG. 6B) in the portions of the positive resist layer under the absorber section becomes 35 mJ/cm² (5 mJ/cm² + 30 mJ/cm²) which is below the sensitivity value 45 mJ/cm² ($D_0$).

Figure 7A:
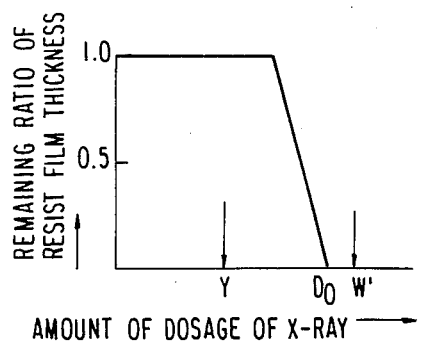
FIGS. 7A and 7B are diagrams for explaining the principle of the X-ray exposure method according to a fourth embodiment of the present invention, FIG. 7A being a diagram showing a characteristic of X-ray resist under an X-ray transmitting section of an X-ray mask, FIG. 7B being a diagram showing the same characteristic under an X-ray absorber section of the mask.
Figure 7B:
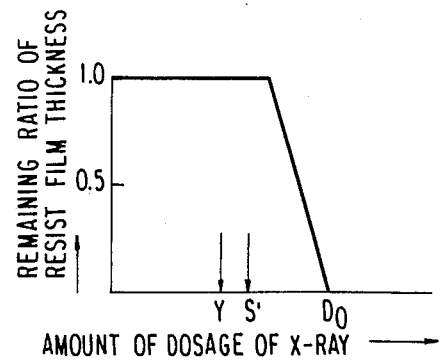

Fourth embodiment:

The process in the same as the second embodiment sown in FIGS. 4A to 4C. However, a positive X-ray resist of the third embodiment is used. At first the uniform irradiation by X-rays 8' of 30 mJ/cm² (Y in FIGS. 7A and 7B) without a mask is performed in the apparatus 200. Next, in the conventional X-ray lithography apparatus 100, the second irradiation by X-rays 8 is conducted by using the mask 6. As shown in FIG. 7A, portions of the positive resist layer under the transmitting section of the mask 6 is irradiated by X-rays of 30 mJ/cm² (W'-Y) in the second step, and the total of X-rays W' irradiated on such portions becomes 60 mJ/cm² (30 mJ/cm² + 30 mJ/cm²), which is beyond the sensitivity value $D_0$ (45 mJ/cm²). On the other hand, as shown in FIG. 7B, portions of the positive resist layer under the absorber section of the mask 6 are irradiated by X-rays of 5 mJ/cm² (S'-Y) in the second step, and the total of X-rays (S') irradiated on such portions becomes 35 mJ/cm² (30 mJ/cm² + 5 mJ/cm²), which is below the sensitivity value $D_0$.

What is claimed is:

1. A method of litography comprising steps of:
   preparing a workpiece having a substrate and a resist layer formed on said substrate, said resist layer having a sensitivity to an electromagnetic wave such that an image is formed by irradiating said wave at selected parts of said resist layer in an amount of irradiation that is greater than a predetermined value and developing said resist layer,
   selectively irradiating a first section of said resist layer by said wave in an amount of irradiation that is less than said predetermined value, whereby a first portion in said first section of said resist layer is substantially irradiated but the amount of said selective irradiation is smaller than said predetermined value and a second portion in said first section of said resist layer, other than said first portion, is not substantially irradiated,
   repeating the same selective irradiation at other sections of said resist layer, and
   subsequently uniformly irradiating said entire resist layer by said wave to an extent that the accumulated amount of irradiation on said respective first portions, before developing said resist layer, is above said predetermined value and the accumulated amount of irradiation on said respective second portions is below said predetermined value.

2. A method of claim 1, in which said substrate comprises a semiconductor body.

3. A method of claim 1, in which the irradiation souce in said first step is different from the irradiation source in said second step.

4. A method of claim 3, in which each of said sources in said first and second steps is a type in which X-rays are emitted from a target by impacting an electron beam onto said target.

5. A method of an X-ray lithography comprising steps of:
   preparing a workpiece having a substrate and a negative type resist layer formed on said substrate, said negative type resist layer having a sensitivity value which is characterized in that after the development and the rinsing of said negative type resist layer which has been irradiated by X-rays in an amount equal to said sensitivity value, the thickness of said negative type resist layer becomes one half of the initial thickness,
   performing a first irradiation with X-rays on entire sections of said negative X-ray resist layer without interposing any X-ray mask between an X-ray source and said negative X-ray resist layer such that the amount of X-rays is below said sensitivity value,
   interposing an X-ray mask between said negative type X-ray resist layer, and said X-ray source, said X-ray mask having a support member, a membrane supported by said support member and an X-ray absorber pattern provided on said membrane to form an X-ray absorber section where said X-ray absorber pattern is present and an X-ray transmitting section which is free of said X-ray absorber pattern,
   performing a second irradiation with X-rays on one section of said X-ray resist layer through said X-ray mask such that the sum of the amount of said X-ray irradiation by said first and second steps of irradiating X-rays is above said sensitive value at a first portion of said negative X-ray resist layer under said X-ray transmitting section of said X-ray mask, and below said sensitive value at a second portion of said negative X-ray resist layer under said X-ray absorber section of said X-ray mask, and repeating a third irradiation with X-rays on another section of said X-ray resist layer, said third irradiation being conducted in the same manner as said second irradiation.

6. A method of claim 5, in which said substrate includes a semiconductor body.

7. A method of claim 6 in which an X-ray source in said first step is different from said X-ray source in said second step.

8. A method of claim 6, in which each of said X-ray sources in said first and second steps is a type in which X-rays are emitted from a target by impacting an electron beam on to said target.

9. A method of short wavelength X-ray lithography comprising steps of:
preparing a workpiece having a substrate and a resist layer formed on said substrate, said resist layer having a sensitivity to said short wavelength X-ray such that a pattern of said resist layer is formed by irradiating said X-rays on selective parts of said resist layer in an amount of irradiation that is greater than a sensitivity value of said resist layer and developing said resist layer,
interposing an X-ray mask between said resist layer and an X-ray source, said X-ray mask having a support member, a membrane supported by said support member and an X-ray absorber pattern provided on said membrane to form an X-ray absorber section where said X-ray absorber pattern is present and an X-ray transmitting section which is free of said X-ray absorber pattern,
selectively irradiating a first section of said resist layer by said X-rays through said mask in an amount of irradiation that is less than said sensitivity value, whereby a first portion in said first section of said resist layer is substantially irradiated but the amount of said irradiation is smaller than said sensitivity value and a second portion in said first section of said resist layer, other than said first portion, is not substantially irradiated,
repeating the same selective irradiation through said mask on a second section of said resist layer, and without a development treatment, and
subsequently uniformly irradiating said entire resist layer by said X-rays to an extent that the accumulated amount of irradiation on respective said first portions is above said sensitivity value and the accumulated amount of irradiation on said respective second portions is below said sensitivity value.

10. A method of claim 9, in which said substrate includes a semiconductor body.

11. A method of claim 9, in which an X-ray source in said first step is different from said X-ray source in said second step.

12. A method of claim 11, in which each of said X-ray sources in said first and second steps is a type in which X-rays are emitted from a target by impacting an electron beam onto said target.

13. A method of an X-ray lithography comprising steps of:
preparing a workpiece having a substrate and a positive type resist layer formed on said substrate, said positive type resist layer having a sensitivity value which is characterized in that after the development and rinsing of said positive type resist layer which has been irradiated by X-rays in an amount equal to said sensitivity value, the thickness of said positive type resist layer becomes equal to zero,
performing a first step of irradiating X-rays on said positive X-ray resist layer without interposing any X-ray mask between an X-ray source and said positive X-ray resist layer such that an amount of X-rays below said sensitivity value irradiates the entire surface of said positive X-ray resist layer,
setting an X-ray mask above a first section of said positive type X-ray resist layer, said X-ray mask having a support member, a membrance supported by said support member and an X-ray absorber pattern provided on said membrane to form an X-ray absorber section where said X-ray absorber pattern is present and an X-ray transmitting section which is free from said X-ray absorber pattern, and
performing a second step of irradiating X-rays on said first section of said X-ray resist layer through said X-ray mask such that the sum of said X-rays by said first and second steps of irradiating X-rays is greater than said sensitive value at a first portion of said positive X-ray resist layer under said X-ray transmitting section of said X-ray mask, and below said sensitive value at a second portion of said positive type X-ray resist layer under said X-ray absorber section of said X-ray mask,
setting said X-ray mask above a second section of said positive type X-ray resist layer, and
performing a third step of irradiating X-rays on said second section of said X-ray resist layer through said mask, said third step of irradiating X-rays being conduct in the same manner as said second step of irradiating X-rays.

14. A method of claim 13, in which said substrate includes a semiconductor body.

15. A method of claim 13, in which an X-ray source in said first step is different from said X-ray source in said second step.

16. A method of claim 15, in which each of said X-ray sources in said first and second steps is a type in which X-rays are emitted from a target by impacting an electron beam onto said target.

17. A method of lithography comprising steps of:
preparing a workpiece having a substrate and a resist layer formed on said substrate, said resist layer having a sensitivity to an electromagnetic wave such that an image is formed by irradiating said wave at selective parts of said resist layer in an amount of irradiation that is greater than a sensitivity level of said resist layer and developing said resist layer.
uniformly irradiating said resist layer by said wave such that the amount of said uniform irradiation is smaller than said sensitivity level,
subsequently selectively irradiating a first section of said resist layer which has been irradiated by said uniform irradiation to an extent that the accumulated amount of irradiation on a first portion in said first section is above said sensitivity level and the accumulated amount of irradiation on a second portion in said first section is below said sensitivity level, and repeating said selective irradiation at a second section of said resist layer which has been irradiated by said uniform irradiation.

* * * * *